United States Patent [19]

Valdois et al.

[11] 4,100,512
[45] Jul. 11, 1978

[54] CRYSTAL OSCILLATOR COMPENSATED AGAINST FREQUENCY SHIFT DUE TO ACCELERATION

[75] Inventors: Michel M. Valdois, Chatillon; Armand B. Dupuy, Cergy-Pontoise, both of France

[73] Assignee: Office National d'Etudes et de Recherches Aerospatiales, Chatillon, France

[21] Appl. No.: 822,889

[22] Filed: Aug. 8, 1977

[30] Foreign Application Priority Data

Aug. 11, 1976 [FR] France .................................. 76 24571
Aug. 4, 1977 [FR] France .................................. 77 23990

[51] Int. Cl.² ............................................. H03B 5/32
[52] U.S. Cl. ................................. 331/158; 331/65; 331/175; 361/278; 361/280
[58] Field of Search ................ 331/65, 116 R, 158, 331/175; 361/278, 280

[56] References Cited

U.S. PATENT DOCUMENTS 2,916,279  12/1959  Stanton .......................... 361/280 X
3,289,055  11/1966  Aizawa et al. ............... 331/116 R X

*Primary Examiner*—Siegfried H. Grimm

[57] ABSTRACT

An electrical oscillator having a piezoelectric resonator, the shift in frequency of which is automatically compensated when the oscillator is subjected to an acceleration. Consequently, the oscillator is practically insensitive to high accelerations and can be used as a frequency standard in an aircraft or space vehicle. Said oscillator comprises, in an oscillator loop, the resonator and a capacitance for adjusting frequency connected in series with the resonator. The adjusting capacitance is formed of at least one variable capacitor. Means sensitive to acceleration are provided for controlling the variable capacitor so that the frequency shift caused by the variable capacitor is opposed to the frequency shift of the resonator caused by acceleration.

7 Claims, 9 Drawing Figures

CRYSTAL OSCILLATOR COMPENSATED AGAINST FREQUENCY SHIFT DUE TO ACCELERATION

BACKGROUND OF THE INVENTION

1. Field of the Invention

The invention relates to an electrical oscillator having a piezoelectric resonator suitable for use as a frequency standard for time bases or clocks in aircraft or space vehicles, for such application as the determination of trajectories in dependance upon time or for guidance of aircraft or space vehicles.

2. Description of the prior art

Although quantum oscillators, and in particular cesium clocks, are practically obligatory developed as primary frequency standards for such applications, oscillators having a piezoelectric resonator and more particularly quartz oscillators have henceforth acquired such a long term stability that their substitution for quantum oscillators can be advantageously envisaged in a number of cases owing to the fact that they are light, less bulky and less costly; but their operation can lead to a number of mechanical resonance phenomena which make them sensitive to accelerations imposed on them by the carrier vehicle.

OBJECT OF THE INVENTION

The principle object of the invention is an oscillator having a piezoelectric resonator, and particularly a quartz oscillator, which is practically insensitive to high acceleration and which can consequently be used as a frequency standard in an aircraft or space vehicle.

SUMMARY OF THE INVENTION

The invention relies on the following observations which are valid for accelerations having a high value as long as the constraints brought about by them do not cause non-linear deformations in the resonators or in their supports:
- the frequency variation of a piezoelectric oscillator is a linear function of the modulus of the imposed acceleration;
- said frequency variation is a sinusoidal function of the angular deviation between the direction of the acceleration and a reference direction dependent, particularly, on the number and position of the fixing points of the piezoelectric crystal of resonator to its support;
- the proportionality coefficient between the shift in frequency and the modulus of the acceleration is practically independent of the number and position of said fixing points.

It is known, additionally, that the frequency of a piezoelectric resonator inserted in an oscillating loop can be corrected to a certain extent by connecting it in series with a variable capacitor.

According to the present invention, there is provided an electrical oscillator comprising, in an oscillation sustaining loop, a resonator having a piezoelectric crystal and a capacitance for adjusting frequency connected in series with the resonator, the adjusting capacitance being formed of at least one variable capacitor, and means sensitive to acceleration imposed on the oscillator for controlling the variable capacitor so that the frequency shift caused by the capacitor is opposed to the frequency shift of said resonator caused by the acceleration.

In other words, if an acceleration of predetermined modulus and direction causes a frequency shift $\Delta F$ of the resonator, the variable capacitance acts automatically to cause a frequency shift substantially equal to $-\Delta F$.

For ease of construction, only one of the geometric parameters, i.e. the distance between the electrodes or the overlapping surface area of the electrodes of the variable capacitor is normally adjustable as a function of the frequency shift. In this respect, the variable capacitor comprises a stationary electrode and a movable massive electrode having a degree of translational freedom, for which the movement provides the variation in the capacitance of the variable capacitor and means sensitive to the acceleration consists of a resilient return member for the movable electrode.

According to a first embodiment, the geometric parameter of the variable capacitor, for example the distance between the electrodes varies linearly with the variations of the frequency shift, so that the compensation for the shift in frequency is substantially equal to the linear variation of the frequency shift as a function of the acceleration.

According to a second embodiment, the geometric parameter of the variable capacitor, for example the overlapping surface area of the electrodes, varies non-linearly with the frequency shift, so that the compensation for the frequency shift is rigorously equal to the linear variations of the frequency shift as a function of the acceleration.

BRIEF DESCRIPTION OF THE DRAWING

The invention will now be more clearly understood from the following description of some embodiments, with reference to the corresponding accompanying drawings, in which.

DESCRIPTION OF THE PREFERRED EMBODIMENTS

Figure 1:
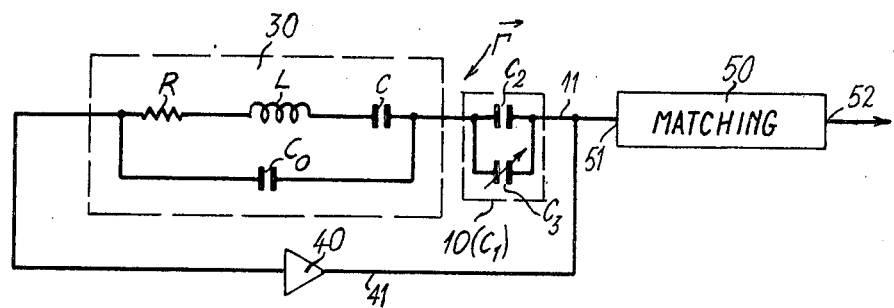
FIG. 1 is a block diagram of an oscillator having a piezoelectric resonator showing the equivalent electrical circuits of a piezoelectric resonator and its variable capacitance.

Referring to FIG. 1, the electric oscillator consists of a series loop which comprises a variable capacitor 10 having a variable capacitance $C_1$, a piezoelectric crystal resonator 30 and an amplifier 40. A circuit 50, the input of which is connected to the output terminal 41 of the amplifier 40 and to one of the terminals 11 of the capacitor 10, matches the level and impedance of the oscillation signal which it provides at its output 52 to circuits or means (not represented) adapted to the above-mentioned applications. A vector $\vec{\Gamma}$ representing the acceleration to which the oscillator is subjected has been shown in an arbitrary direction and for which the object of the invention is to compensate its effects by means of an automatic variation in the value of the capacitance $C_1$.

Figure 2:
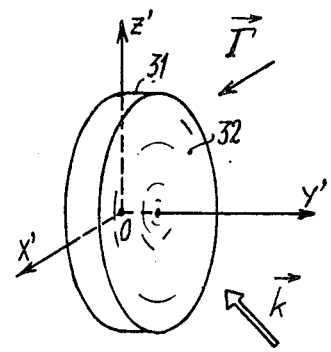
FIG. 2 is a schematic perspective view of a piezoelectric crystal with regard to its principal axes.

Turning now to FIG. 2 which shows the piezoelectric crystal 31 of the resonator 30 and these three principal axes which are represented, according to practice, as OX', OY' and OZ'. The crystal 31 is, for example, a quartz crystal having an AT cut. It is known that this cut provides the maximum frequency stability and a minimum sensitivity to variations in temperature. To provide for maximum resonance, the face 32 of the crystal 31 is in the form of a portion of sphere for which the convexity is oriented in the direction OY'.

The frequency deviation $\Delta F$ of such quartz crystals in different directions relative to the principal axes has been determined by means of experiments with rotating arms, by varying the number of points of resonator support (not shown in FIG. 2) for different values of acceleration. It has been found that, in all cases, the frequency deviation $\Delta F$ on either side of the nominal frequency defined as the frequency under zero acceleration, can be expressed by an equation of the form:

$$\Delta F = k_x \Gamma_x = k_y \Gamma_y = k_z \Gamma_z \quad (1)$$

an expression in which $\Delta F$ is expressed in Hertz, $\Gamma_x$, $\Gamma_y$ and $\Gamma_z$ are the respective projections of the acceleration vector $\vec{\Gamma}$ on the three principal axes OX', OY' and OZ', and $k_x$, $k_y$ and $k_z$ are coefficients of proportionality characteristic of said resonator which are practically constant over an wide range of values of acceleration.

By way of example, it is found for a quartz crystal having an AT cut as defined above and vibrating at the nominal frequency of $5 \times 10^6$ Hertz, that:

$$k_x = 10^{-2} \, k_y = 2 \cdot 10^{-2} \, k_z = 10^{-2}$$

for values of acceleration between $-50g$ and $+50g$. The coefficients $k_x$, $k_y$, $k_z$ are expressed in Hertz per unit of acceleration due to terrestrial gravity (Hz/g).

It will noted that equation (1) is in the form of a scalar product:

$$\Delta F = \vec{k} \cdot \vec{\Gamma} \quad (2)$$

in which $\vec{\Gamma}$ is the acceleration vector and $\vec{k}$ is a vector expressing, in modulus and in direction, the sensitivity to acceleration of the resonator under consideration.

Referring again to FIG. 1, it will be recalled that the frequency of oscillation of the resonator 30 can be corrected by the addition of a capacitance in series. The electric equivalent of the resonator 30 and the structure of the variable correcting capacitor 10 have been shown. The series resonant circuit consisting of the resistance R, the inductance L and the capacitance C corresponds to the piezoelectric crystal of resonator and the capacitor $C_0$ to the inter-electrode capacitance of resonator. $C_1$ is the value of the capacitance of the variable capacitor 10.

It will be recalled that the shift in frequency $\Delta F$ caused by the addition of the capacitance $C_1$ is expressed by the following equation:

$$\Delta F/F = C/(2(C_0+C_1)) + R^2 C_0^2/(2LC_1) \quad (3)$$

By way of example, for a quartz crystal such as that which has already been considered ($F = 5 \times 10^6$ Hertz), one can assume the following approximate values:
$C = 10^{-16}$ Farad
$R = 100$ Ohms
$L = 10$ Henry
$C_0 = 5 \times 10^{-12}$ Farad If the value of the capacitance $C_1$ is substantially greater than that of capacitance $C_0$, the equation (3) becomes, to a first approximation:

$$\Delta F/F = C/(2(C_0+C_1)) \quad (4)$$

In fact, to obtain a more accurate control of the frequency, in general the capacitor 10 of capacitance $C_1$, comprises two capacitors in parallel, one having a fixed capacitance $C_2$ and the other having a variable capacitance $C_3$, the capacitance $C_2$ being substantially greater than $C_3$. The equation (4) then becomes:

$$\Delta F/F = C/(2(C_0+C_2+C_3)) \quad (5)$$

and the sensitivity of the adjustment can be expressed as follows:

$$d(\Delta F) = -\Delta F \cdot dC_3/(C_0+C_2+C_3) \quad (6)$$

or $$d(\Delta F) \sim -dC_3 \quad (7)$$

The sign $\sim$ indicates the proportionality of the two members of the previous expression.

In accordance with the invention, the previous considerations justify the use of a variable capacitor connected in series with the resonator and means to make the value of the capacitance of the capacitor dependent on the value of the acceleration to compensate the shift in frequency of said resonator caused by said acceleration.

One could for example make one of the geometric parameters so that they had a degree of freedom (degree of overlap or distance between the electrodes) which controls the capacitance of the variable capacitor dependent upon the value of the signal produced by an acceleration sensor. But the invention provides a preferable solution which is particularly simple and efficient and which consists in making the acceleration sensor part of the variable capacitor by mounting the movable electrode thereof by means of a resilient return member.

In accordance with a first embodiment of the invention, it will be seen that, by conferring a predetermined mass M to the movable electrode and a predetermined spring constant $\lambda$ to the resilient return member, one can assign a substantially predetermined linear law for the variation of said parameter as a function of acceleration. For reasons of sensitivity to the acceleration and facility of construction, the distance between the electrodes is preferably chosen as the dependent parameter. As for the resilient return means, use can be made for example of an enclosed gaseous volume between the electrodes and an elastic gas-tight sleeve. It is however simpler to use a suspension having elastic blades such as will be described with reference to FIGS. 3 and 4.

The stationary electrode 12 of a capacitor having a capacitance $C_3$ is glued on an insulating support 13 extended by arms 14. The movable electrode 15 parallel to the electrode 12 is a plate of conductive resilient material, for example an alloy of nickel, being extended by two blades 16 having a spring constant λ which overlap the arms 14 and in which longitudinal grooves 17 are formed. Stud bolts 18 are provided in the arms 14 and support the blades 16 in the grooves in which they penetrate by means of threaded ends 19, on which are screwed tightening units 21. The nuts 21 are not shown in FIG. 4. A plate 22 of insulating material is glued on the armature 15 and plays the roll of an inertia block having a mass M.

The electrodes 12 and 15 are respectively connected by conductors 23 and 24 crossing parts 13 and 22 to the output conductors 25 and 26.

Figure 3:
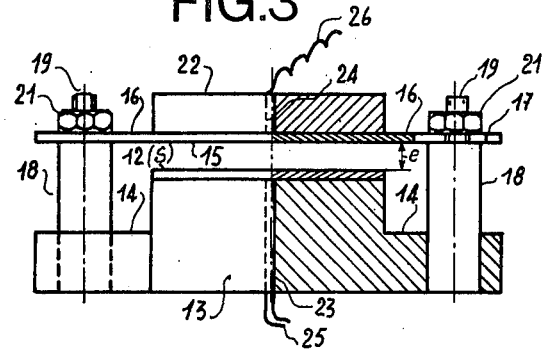
FIG. 3 is a side elevation of a variable capacitor for acceleration compensating according to a first embodiment of the invention, the right half being shown in section.
Figure 4:
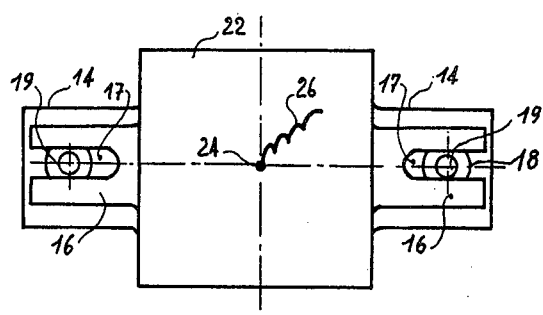
FIG. 4 is a below view of the same capacitor, to the same scale as FIG. 3.

The variable capacitance $C_3$ of the capacitor whose structure is shown in FIGS. 3 and 4, is represented by the classical formula:

$$C_3 = \epsilon_0 S/e \qquad (8)$$

in which $\epsilon_0$ is the permittivity of air equal to $8.84 \times 10^{-12}$ F/m, $S$ is the overlapping surface area of the electrodes and $e$ is the distance between the electrodes. Given the symmetry of the mechanical links, S is practically invariant and only $e$ varies linearly as a function of the acceleration. If the directions of the vector $\vec{k}$ (see equation (2)) is known, for example by means of a previous determination of the coefficients $k_x$, $k_y$, $k_z$ of equation (1), the capacitor of capacitance $C_3$ can be arranged so that the surface area of its electrodes is perpendicular to said vector $\vec{k}$.

According to formula (8), a value $\Gamma_k$ of the component of $\vec{\Gamma}$ in the direction $\vec{k}$ such that it causes a variation $de$ of the distance $e$, causes a variation in capacitance:

$$dC_3 = -\epsilon S de/e^2 \qquad (9)$$

and $$dC_3 \sim -de \qquad (10)$$

For a given mass M of the inertia block 22 (the mass of the plate 15 being negligible) and a spring constant λ of the blades 16:

$$de \sim \Gamma \qquad (11)$$

from which $$dC_3 \sim -\Gamma \qquad (12)$$

and it will be seen, by comparing equations (7) and (12):

$$d(\Delta F) \sim -dC_3 \sim -\Gamma \qquad (13)$$

It is therefore possible to provide by means of a variable capacitor having an elastic suspension of the type described with reference to FIGS. 3 and 4, by suitable determining its geometrical and mechanical parameters (distance between the electrodes, overlapping surface area, spring constant of the blades) by construction or by means of adjustable members not shown in FIGS. 3 and 4, a compensation which is substantially exactly equal to the shift in frequency brought about by the accelerations to which the oscillator is subjected.

According to a second embodiment of the invention, the compensation for the shift in frequency caused by the accelerations to which the oscillator is still subjected is rigorously exact.

In the equation (5), the sensitivity of adjustment can be deduced as follows:

$$d(\Delta F) = -C.F.\, dC_3/(2(C_0+C_2+C_3)^2) \qquad (14)$$

and equally from the equation (2)

$$d(\Delta F) = d\,(\vec{d}\cdot\vec{\Gamma}) \qquad (15)$$

It appears from the two previous equations that the compensation in the acceleration effects by a variable capacitance $C_3$ is not purely linear on account of the non-linear term as a function of $C_3$ in the denominator of the equation (14). Thus, the total variation law depends on the law for the variation of frequency as a function of the capacitance $C_1$ (or $C_3$) of the variable capacitor 10, and on the law for the variation of the capacitance $C_1$ as a function of the acceleration $\vec{\Gamma}$.

As has already been stated, this latter law is dependent essentially on two geometric parameters, i.e. the distance $e$ between the electrodes and the overlapping surface area S of the electrodes of the capacitance $C_3$ which is given by the formula (8). From this, the variation in capacitance is given by:

$$dC_3 = \epsilon_0\, dS/e - \epsilon_0 S\, de/e^2 \qquad (16)$$

In a similar manner to the first embodiment, for reasons of simplicity of construction, only a single parameter $e$ or S for which the non-linear variation corrects the shape of the electrode of the capacitor of capacitance $C_3$ is retained in order to compensate exactly for the linear variation of the shift in frequency of the resonator caused by the acceleration $\vec{\Gamma}$.

Figure 5:
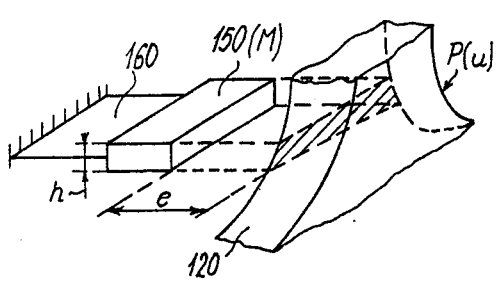
FIG. 5 is a schematic perspective diagram of a variable capacitor for acceleration compensating according to a second embodiment of the invention.

According to a preferred embodiment shown in FIG. 5, the capacitance $C_3$ varies as a function of the surface area S by means of a flexible blade 160, one of the ends of which is embedded while the other end is fixed longitudinally to one of the electrodes 150 of the capacitor of capacitance $C_3$. This movable electrode 150 in the form of rectangular parallelepiped offers a projecting part S to another stationary electrode 120. The distance $e$ between the electrodes 120 and 150 is practically constant. The electrode 120 has a profile P(u) on each of its transverse edges which is symmetrical in relation to the transverse median plane of the movable electrode 150 of which the shape allows the effect of non-linearity to be compensated.

The stationary electrode 120 is insulated from the movable electrode 150 and the movable electrode 150 is maintained by the blade 160 by means of a fixing assembly for example similar to that described with reference to the first embodiment shown in FIG. 3 (elements 14, 17, 19, 21).

Figure 6:
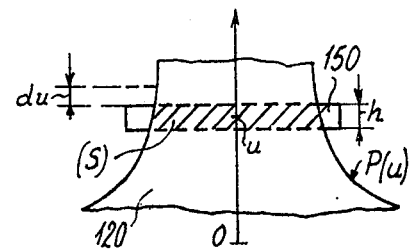
FIG. 6 is a diagrammatic section of the stationary electrode of the variable capacitor of FIG. 5.

Referring now to FIG. 6, the outline of the surface of the stationary electrode 120 has been shown bounded by transverse edges having a profile P(u) which are symmetrical in relation to an axis Ou perpendicular to the blade 160 and parallel to the vector $\vec{k}$ of sensitivity to acceleration and for which the direction is assumed to be constant. In this case, by designating the mass of the movable electrode 150 as M, the movable electrode 150 playing the roll of the inertia block, and by $\Gamma$ the component of the acceleration vector $\vec{\Gamma}$ in the direction $\vec{k}$, the fundamental dynamics equation relative to a small displacement d$u$ of the electrode 150 in the direction $\vec{k}$ (or O$u$) leads to the following equation:

$$\lambda du = M\, d\Gamma \tag{17}$$

where $\lambda$ in kg/s$^2$ is the spring constant of the blade 160.

From equations (14) to (17), profile P($u$) appropriate for compensating for the effects due to non-linearity can be formulated and defined as:

$$S = 2 \int_{u-\frac{h}{2}}^{u+\frac{h}{2}} P(u)\, du \tag{18}$$

where $h$ and $u$ represent the thickness and the co-ordinate of the middle point of the movable electrode 150.

By substituting $d\Gamma$ given by the equation (17) in the equation (15) and by expressing $dC_3$ by the equation (16), the equation (14) is rewritten as:

$$\frac{k\lambda\, du}{m} = \frac{C.F.\,(\epsilon_0\, dS/e)}{2(C_0+C_2+\epsilon_0 S/e)^2}$$

The previous first-order differential equation expressing the function S as a function of the variation of $u$ can be written in the following form:

$$A\, du = \frac{dS}{(S-B)^2} \tag{19}$$

where $A$ and $B$ are constant such that:

$$A = \frac{2 \cdot k \cdot \lambda \cdot \epsilon_0}{M \cdot C \cdot F \cdot e} \text{ in m}^{-3} \tag{20}$$

and $$B = \frac{-(C_0+C_2)e}{\epsilon_0} \text{ in m}^2 \tag{21}$$

By integrating equation (19), one find that $$S(u) = \frac{1}{A(u-k)} + B \tag{22}$$

where $K$ is a constant of integration determined from the initial conditions under zero acceleration, that is to say as a function of the overlapping surface area $S_0$ in the rest position $u_0$ of the movable electrode 150:

$$K = u_0 - 1/(A\cdot(S_0-B))$$

The profile P($u$) deduced from the derived function of S($u$) is given by the equation (22), ignoring the sign:

$$P(u) = \frac{1}{A(u-k)^2} \tag{23}$$

From the previous equation (23), it appears that one proceeds firstly to an adjustment of the nominal value of the capacitance $C_3$ such as:

$$(C_3)_0 = \epsilon_0 S_0/e$$

and that under an acceleration $\vec{\Gamma}$, the displacement d$u$ of the mass M of the electrode 150 will allow the compensation for non-linearity to be improved.

According to other embodiments of the present invention, the vector $\vec{k}$ is unknown. Calculations show that the compensation can be obtained by means of three variable capacitors of the type described above, the capacitors being connected in parallel with themselves and in series with the resonator 30, and arranged respectively so that the displacements of their movable electrodes (15 or 150) are parallel to the three principal axes OX', OY', OZ' of the piezoelectric crystal 31 of the resonator 30.

Figure 8:
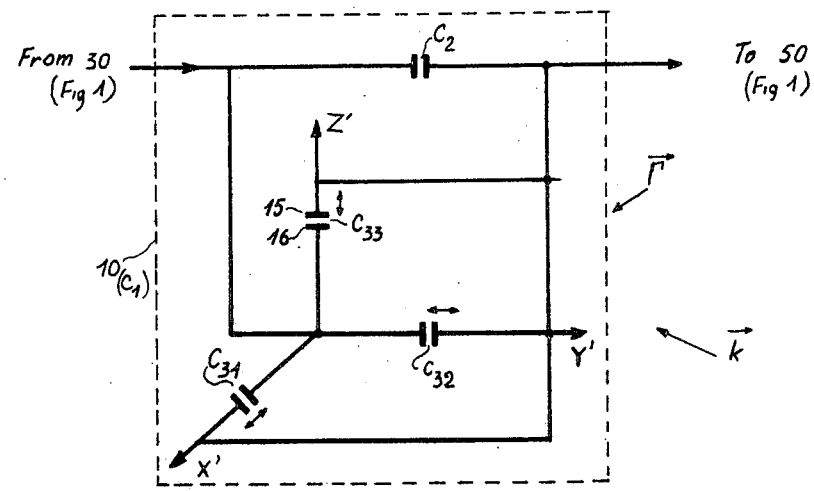
FIGS. 8 and 9 show the arrangement of three variable capacitances of the variable capacitor according to the first and second embodiments when the sensitivity vector of the acceleration is unknown.

By referring to FIG. 8, the arrangement of the electrodes 15 and 16 of the three variable capacitors $C_{31}$, $C_{32}$ and $C_{33}$ whose surfaces are perpendicular to the three axes OX', OY' and OZ', respectively, is shown diagrammatically according to the above mentioned example of the first embodiment for which their inter-electrode distance varies along their principal respective axes.

Figure 9:
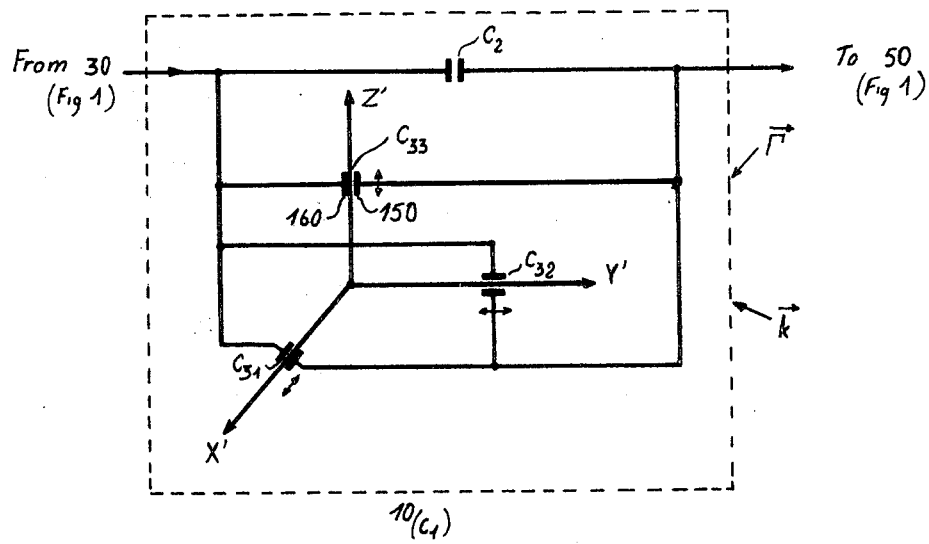

On the contrary, referring to FIG. 9, the three variable capacitors $C_{31}$, $C_{32}$ and $C_{33}$ have the surfaces of their electrodes 120 and 150 arranged in parallel and at a constant respective distance $e/2$ from the axes OX', OY' and OZ' respectively, according to the above mentioned example of the second embodiment.

In a general manner, each capacitor $C_{31}$, $C_{32}$ or $C_{33}$ is analogous to one as described in accordance with the first or the second embodiment of the invention.

In either of the previous cases, the capacitance of the compensation capacitor is such that $C_1 = C_2 + C_{31} + C_{32} + C_{33}$.

Application of the Second Embodiment

Figure 7:
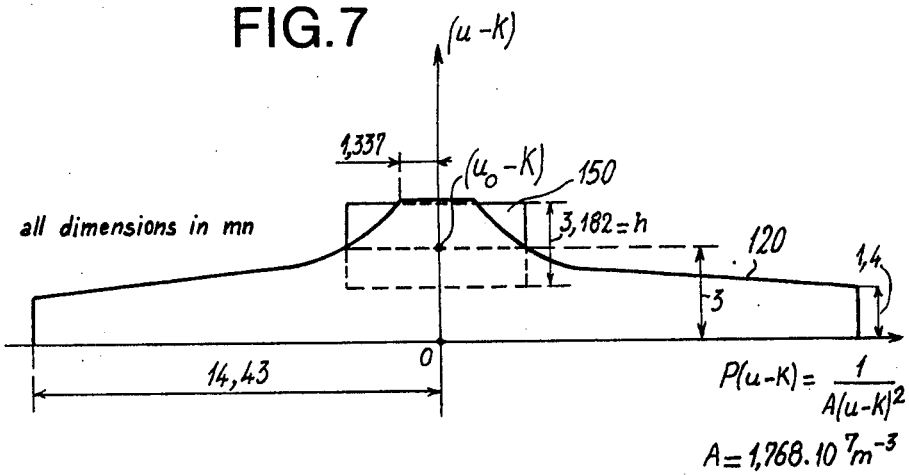
FIG. 7 shows the shape of the transverse edges of the stationary electrode according to a numerical example.

By way of non-limiting example, FIG. 7 shows the profile of of the stationary electrode 120 (dimensions expressed in mm in FIG. 7) of the variable capacitor having an adjustable capacitance $C_3$ for the following initial values:

$C = 10^{-16}$ Farad; $C_0 = 5\times10^{-12}$ Farad; $C_2 = 20\times10^{-12}$ Farad;
$F = 5\times10^6$ Hz;
$\lambda = 10^5$ Newton/m; $M = 5\times10^{-3}$ kg;
$e = 10^{-4}$ m;
rest position: $S_0 = 10^{-5}$ m$^2$; $(u_0 - K) = 3\times10^{-3}$ m.

From the previous equations (18) and (20) to (23), it is deduced that:
$(C_3)_0 = 0.884\times10^{-12}$ Farad;
$A = 1.768\times10^7$ m$^{-3}$;
$B = -2.82\times10^4$ m$^2$; and
$h = S_0[P(u_0 - K)] = 3.182\times10^{-3}$ m Also the following table of values is deduced:

| $(u_0 - K)$ in meters | $1.4\times10^{-3}$ | $3\times10^{-3}$ | $4.6\times10^{-3}$ |
|---|---|---|---|
| P($u_0$) in meters | $14.43\times10^{-3}$ | $3.142\times10^{-3}$ | $1.337\times10^{-3}$ |

What we claim is:

1. In an oscillation sustaining loop of an electrical oscillator, that improvement comprising:
    a resonator having a piezoelectric crystal;
    an adjusting capacitance for adjusting the resonator frequency which is connected in series with said resonator, said adjusting capacitance being formed of at least one variable capacitor; and
    means sensitive and responsive to acceleration imposed on said oscillator for controlling said variable capacitor whereby the frequency shift caused by said variable capacitor is opposed and substantially equal to the frequency shift of said resonator caused by the acceleration imposed on said oscillator.

2. In an oscillation sustaining loop of an electrical oscillator, that improvement comprising:
a resonator having a piezoelectric crystal and an adjusting capacitance for adjusting the frequency which is connected in series with said resonator;
said adjusting capacitance being formed of at least one variable capacitor;
said variable capacitor comprising a stationary electrode and a massive movable electrode having one degree of translational freedom whereby the movement of said electrode provides the variation in the capacitance of said variable capacitor; and
a resilient return member operatively connected to said movable electrode, said return member being sensitive to acceleration imposed on said oscillator thereby controlling said variable capacitor so that the frequency shift caused by said variable capacitor is opposed and substantially equal to the frequency shift of said resonator caused by said acceleration.

3. In an oscillation sustaining loop of an electrical oscillator, that improvement comprising:
a resonator having a piezoelectric crystal;
an adjusting capacitance for adjusting the resonator frequency which is connected in series with said resonator;
said adjusting capacitance being formed of at least one variable capacitor;
said variable capacitor comprising a stationary electrode and a massive movable electrode, the distance between the stationary and movable electrodes being variable;
a resilient return member sensitive to acceleration imposed on said oscillator which consists of flexible blades fixed to said movable electrode; and
means for maintaining said movable electrode parallelly to said stationary electrode whereby the frequency shift caused by the movement of said movable electrode is opposed and substantially equal to the frequency shift of said resonator caused by said acceleration.

4. In an oscillation sustaining loop of an electrical oscillator, that improvement comprising:
a resonator having a piezoelectric crystal;
an adjusting capacitance for adjusting the frequency which is connected in series with said resonator;
said adjusting capacitance being formed of at least one variable capacitor;
said variable capacitor comprising a stationary plane electrode and a movable plane electrode having overlapping surfaces of said electrodes, the overlapping surfaces of said electrodes being variable;
a resilient return member sensitive to acceleration imposed on said oscillator which consists of flexible blades fixed to said movable electrode; and
means for maintaining said movable electrode at a constant distance from and parallel to said stationary electrode whereby variation of capacitance compensates for variation in frequency of said resonator caused by said acceleration.

5. An electrical oscillator as claimed in claim 4 wherein one of said electrodes of said variable capacitor has a rectangular surface and the other electrode has symmetrical profiled edges with respect to the middle plane of said rectangular electrode parallel to the direction of the translational movement, the profile of said profiled edges being expressed by the function of the displacement ($u$) of the electrode:

$$P(u) = 1/(A(u-K)^2)$$

where $A$ is a constant dependent on the mechanical and geometric parameters of said return member and of said variable capacitor and $K$ is a constant dependent on said geometric and mechanical parameters and also on said overlapping surface of said electrodes under zero acceleration of said oscillator.

6. In an oscillation sustaining loop of an electrical oscillator, that improvement comprising:
a resonator having a piezoelectric crystal;
an adjusting capacitance for adjusting the frequency which is connected in series with said resonator;
said adjusting capacitance being formed of at least one variable capacitor;
said variable capacitor comprising a stationary electrode and a massive movable electrode having one degree of translational freedom for which the movement provides the variation in the capacitance of said variable capacitor;
a resilient return member operatively connected to said movable electrode sensitive to acceleration imposed on said oscillator thereby controlling said variable capacitor so that the frequency shift caused by said variable capacitor is opposed and substantially equal to the frequency shift of said resonator caused by said acceleration; and
said variable capacitor and said resilient return member being oriented such that said translational movement of said movable electrode is parallel to the vector of sensitivity to the acceleration of said piezoelectric crystal of said resonator.

7. In an oscillation sustaining loop of an electrical oscillator, that improvement comprising:
a resonator having a piezoelectric crystal;
an adjusting capacitance for adjusting the frequency which is connected in series with said resonator;
said adjusting capacitance being formed of three variable capacitors which are connected in parallel with each other and in series with said resonator;
each of said variable capacitors comprising a stationary electrode and a massive movable electrode; and
three means associated with respective ones of said three movable electrodes and each sensitive to acceleration imposed along a respective one of three crystal axes of said piezoelectric crystal for respectively controlling the movement of said movable electrodes so that the frequency shift caused by said variable capacitors is opposed and substantially equal to the frequency shift of said resonator caused by said acceleration.

* * * * *